(12) United States Patent
Ishino

(10) Patent No.: US 6,866,972 B2
(45) Date of Patent: Mar. 15, 2005

(54) COLOR LAYER FORMING METHOD

(75) Inventor: Takayuki Ishino, Kagoshima (JP)

(73) Assignee: NEC LCD Technologies, Ltd., Kawasaki (JP)

(*) Notice: Subject to any disclaimer, the term of this patent is extended or adjusted under 35 U.S.C. 154(b) by 0 days.

(21) Appl. No.: 10/438,713

(22) Filed: May 15, 2003

(65) Prior Publication Data
US 2003/0215574 A1 Nov. 20, 2003

(30) Foreign Application Priority Data
May 15, 2002 (JP) ........................................ 2002-140157

(51) Int. Cl.$^7$ .......................... G02B 5/20; G02F 1/1335
(52) U.S. Cl. ........................................... 430/7; 430/330
(58) Field of Search ..................................... 430/7, 330

(56) References Cited

FOREIGN PATENT DOCUMENTS

| JP | 08-194109 | 7/1996 |
| JP | JP 11-174221 A * | 7/1999 |
| JP | 11-337724 | 12/1999 |

OTHER PUBLICATIONS

Computer-generated translation of JP 11–174221, Masayoshi (Jul. 1999).*

* cited by examiner

Primary Examiner—John A. McPherson
(74) Attorney, Agent, or Firm—Katten Muchin Zavis Rosenman

(57) ABSTRACT

For each of colored resists, a resist coating step of coating a washed substrate with the colored resist, a reduced-pressure drying and temporary baking step of evaporating solvent contained in the colored resist, an exposing step of printing a pattern in the colored resist, a developing the printed pattern and a photo-curing and temporary post-baking step of hardening a surface portion of the resist to a hardness level, in which there is no defect of the printed colored resist pattern occurs in a coating step and a developing step, which are performed later, are repeated. In forming a last colored resist, a normal baking step of simultaneously hardening all of the coated colored resist patterns is performed, instead of the photo-curing and temporary post-baking step.

11 Claims, 6 Drawing Sheets

COLOR LAYER FORMING METHOD

BACKGROUND OF THE INVENTION

1. Field of the Invention

The present invention relates to a method for forming a color layer for use in a color filter, etc., and, in particular, the present invention relates to a method for forming a color layer, which includes a plurality of colored resists, on a substrate.

2. Description of the Related Art

One of important conditions required in a colored resist hardening step in a fabrication method for forming an optical color filter used in a flat display panel such as a plasma display panel or in a camera, etc., is that the colored resist hardening step does not cause defect or abnormality in a resist pattern to be formed in a later step.

A conventional procedure for forming a color filter on a substrate will be described with reference to FIG. 6.

After a pre-cleaning step to be performed in order to wash away extraneous substances adhered to the substrate (step S31, step S38, step S45), a resist coating step (step S32, step S39, step S46) for coating the substrate with a light-sensitive colored resist is performed. Thereafter, a drying step (step S33, step S40, step S47) under reduced-pressure for evaporating and removing solvent contained in the resist and a temporary baking step (step S34, step S41, step S48) are performed. Subsequent to the temporary baking step, an exposing step (step S35, step S42, step S49) for printing a pattern in the resist is performed and then a developing step (step S36, step S43, step S50) for developing the printed pattern is performed. Thereafter, a normal baking step (step S37, step S44, step S51) for sufficiently heating the developed pattern formed on the substrate to completely evaporate solvent contained in the resist and thermally harden the patterned resist by a hotplate or an oven is performed. The above series of the steps is performed every time when each of the first, second and third primary colored filter patterns is formed.

However, in the above mentioned fabrication procedure, the normal baking is performed at a temperature of 200~230° C. for about 1 hour. Therefore, considering a time for heating the substrate up to the baking temperature and a time for cooling the substrate, a required time in the normal baking step becomes 3~4 hours, which is the longest time in the color filter fabrication procedure. Therefore, there is a problem in view of improvement of producibility of color filter.

In order to solve this problem, JPH11-337724A, for example, discloses a technique in which the hardening step of the resist is performed in a temporary post-baking step under a generous condition compared with the condition of the normal baking step.

According to the technique disclosed in JPH11-337724A, a temporary post-baking step, that is, a half-hardening step, for thermally hardening the resist pattern to a hardness level, in which the resist pattern is not peeled off in the succeeding developing step, is used in lieu of the normal baking step for complete hardening the resist under the above mentioned condition for every color layer. However, after the last color layer of three primary color layers is patterned, the normal baking of the three color layers is performed at one time. Thus, the disclosed method is effective in reducing a time required for the resist hardening step of the color layer forming method including the pattern formation by coating the substrate with the resist on the substrate and repeating the pattern formation for the primary colors.

However, a further reduction of time required for the color layer forming method is requested. It may be thought that further reduction of the required time is possible by not further reducing a time required for the temporary post-baking step but slightly increasing the temperature of the temporary post-baking step. However, according to experiments conducted by the present inventors, it has been found that the surface hardness of the color layer resist becomes insufficient and developing agent in the subsequent step soaks into the color layer.

SUMMARY OF THE INVENTION

Consequently, an object of the present invention is to provide a color layer forming method, which is featured by that a half-hardening step is performed by combining a surface hardening step using light and a surface hardening step for hardening a surface of the color layer on the side of the substrate, that is, an interface side surface of the color layer, by heat from the substrate. With the color layer forming method, it is possible to substantially reduce a time required for the hardening step, resulting in high producibility of a color filter.

Another object of the present invention is to provide a color filter forming method by utilizing the color layer forming method.

Another object of the present invention is to provide a color filter fabricated by using the color filter forming method.

In order to achieve the above objects, the color layer forming method for forming a color layer including a plurality of colored resists on a substrate according to the present invention comprises, for every colored resist other than the last colored resist of the plurality of the colored resists, the step of coating the substrate, which is washed, with the colored resist, the step of drying the substrate under reduced-pressure condition to evaporate solvent contained in the colored resist and temporarily baking the substrate, the step of exposing the colored resist to print a pattern in the latter colored resist, the step of developing the pattern, the step of photo-curing and temporarily baking the colored resist pattern to a hardness level in which there is no defect of a printed colored resist pattern in a resist printing step and a developing step, which are performed later, the step of repeating the above mentioned steps and, for the last colored resist, the step of coating the substrate, which is washed, with the last colored resist, the step of drying the substrate under reduced-pressure condition to evaporate solvent contained in the last colored resist and temporarily baking the substrate, the step of exposing the last colored resist to print a pattern in the latter colored resist, the step of developing the colored resist pattern and the step of normally baking all of the coated colored resist patterns simultaneously.

The color filter forming method for forming a color layer including a plurality of colored resists and a light shield layer formed of a light sensitive black resist on a substrate according to the present invention comprises, for every colored resist of the plurality of the colored resists other than the last colored resist thereof, the step of coating the washed substrate with the colored resist, the step of drying the substrate under reduced-pressure condition to evaporate solvent contained in the colored resist and temporarily baking the substrate, the step of exposing the colored resist to print a resist pattern of the colored resist, the step of developing the pattern, the step of photo-curing and temporarily baking the colored resist pattern to a hardness level in which there is no defect of a printed colored resist pattern in a resist printing step and a developing step, which are performed later, the step of repeating the above mentioned steps and, for the last colored resist, the step of coating the colored resist on the washed substrate, the step of drying the substrate under reduced-pressure condition to evaporate solvent contained in the colored resist, the step of temporarily baking the substrate, the step of exposing the colored resist to print a pattern of the colored resist, the step of developing the colored resist pattern, the step of normally baking all of the colored resist patterns simultaneously.

The color filter forming method for forming a color layer including a plurality of color layers and a transparent organic interlayer film formed of a negative type resist on a substrate according to the present invention comprises, for every colored resist of the plurality of the colored resists other than the last colored resist, the step of coating the washed substrate with the colored resist, the step of drying the substrate under reduced-pressure condition to evaporate solvent contained in the colored resist, the step of temporarily baking the substrate, the step of exposing the colored resist to print a pattern in the colored resist, the step of developing the pattern, the step of photo-curing and temporarily baking the colored resist pattern to a hardness level in which there is no defect of a printed colored resist pattern in a resist printing step and a developing step, which are performed later, the step of repeating the above mentioned steps and, for the last transparent organic interlayer film, the step of coating the washed substrate with the colored resist, the step of drying the substrate under reduced-pressure condition to evaporate solvent contained in the colored resist, the step of temporarily baking the substrate, the step of exposing the colored resist to print a pattern of the colored resist, the step of developing the colored resist pattern, the step of normally baking all of the coated colored resist patterns and the transparent organic interlayer films simultaneously.

In the present invention, it is possible to form a color layer including a plurality of colored resists on a substrate in which a wiring and a thin film transistor of amorphous silicon are formed. Further, in the color filter having a color layer including a plurality of colored resists on a substrate, according to the present invention, is featured by that, for every colored resist of the plurality of the colored resists except a last colored resist thereof, the step of coating the washed substrate with the colored resist, the step of drying the substrate under reduced-pressure condition to evaporate solvent contained in the colored resist and temporarily baking the substrate, the step of exposing the colored resist to print a pattern in the colored resist, the step of developing the pattern, the step of hardening the printed pattern to a hardness level, in which there is no defect of a printed colored resist pattern in a resist printing step and a developing step, which are performed later, the step of repeating the above mentioned steps and, for the last colored resist, in forming the last colored resist pattern, the step of coating the washed substrate with the colored resist, the step of drying the substrate under reduced-pressure condition to evaporate solvent contained in the colored resist and temporarily baking the substrate, the step of exposing the colored resist to print a pattern in the colored resist, the step of developing the pattern, the step of hardening the printed pattern to a hardness level, in which there is no defect of a printed colored resist pattern in a resist printing step and a developing step, which are performed later, and the step of simultaneously hardening all of the coated colored resist patterns by not the hardening due to light and heat but a normal baking.

According to another embodiment of the present invention, a color filter having a light shield layer formed of light sensitive black resist and a color layer including a plurality of colored resists, which are formed on a substrate is provided. The light shield layer and the respective colored resists except a last colored resist are formed by the step of coating the washed substrate with the colored resist, the step of drying the substrate under reduced-pressure condition to evaporate solvent contained in the colored resist and temporarily baking the substrate, the step of exposing the colored resist to print a pattern in the colored resist, the step of developing the pattern, the step of hardening the printed pattern to a hardness level, in which there is no defect of a printed colored resist pattern in a resist printing step and a step of developing, which are performed later, and the step of repeating the above mentioned steps and, for the last colored resist, by the step of coating the washed substrate with the colored resist, the step drying the substrate under reduced-pressure condition to evaporate solvent contained in the colored resist and temporarily baking the substrate, the step of exposing the colored resist to print a pattern in the colored resist, the step of developing the pattern, the step of hardening the printed pattern to a hardness level, in which there is no defect of a printed colored resist pattern in a resist printing step and a step of developing, which are performed later the step of simultaneously hardening all of the coated colored resist patterns by not the hardening due to light and heat but a normal baking.

According to a further embodiment of the present invention, a color filter having a color layer including a plurality of colored resists and a transparent organic interlayer film formed of a negative type resist, which are formed on a substrate, is featured by that the respective colored resist layers and the transparent organic interlayer film are formed by the step of coating the substrate, which is washed, with the colored resist, the step of evaporating solvent contained in the colored resist by a reduced-pressure drying and a temporary baking, the step of exposing the colored resist to print a pattern therein, the step of developing the printed pattern and hardening the colored resist pattern to a hardness level in which there is no defect of a printed colored resist pattern in a resist printing step and a developing step, which are performed later, the step of repeating the above steps and, for the last colored resist, by the step of coating the substrate, which is washed, with the colored resist, the step of evaporating solvent contained in the colored resist by a reduced-pressure drying and a temporary baking, the step of exposing the colored resist to print a pattern therein, the step of developing the printed pattern and hardening the colored resist pattern to a hardness level in which there is no defect of a printed colored resist pattern in a resist printing step and a developing step, which are performed later and the step of normally baking all of the colored resist patterns simultaneously when the last transparent organic interlayer film is formed.

DETAILED DESCRIPTION OF THE PREFERRED EMBODIMENTS

Figure 1:
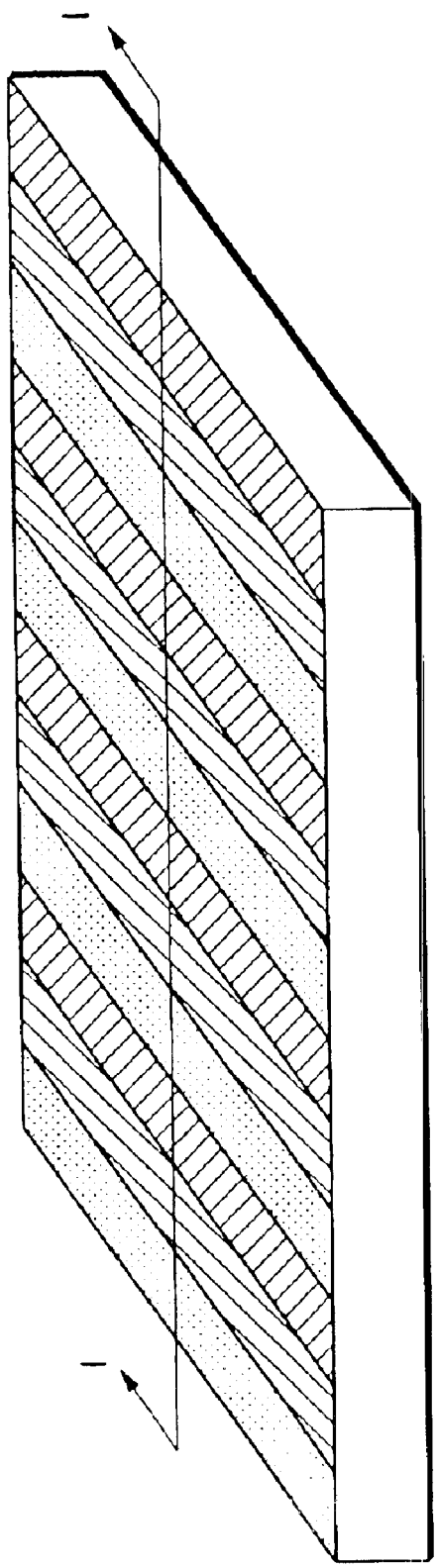
FIG. 1 is a plan view of a substrate of a color filter according to the present invention.
Figure 2:
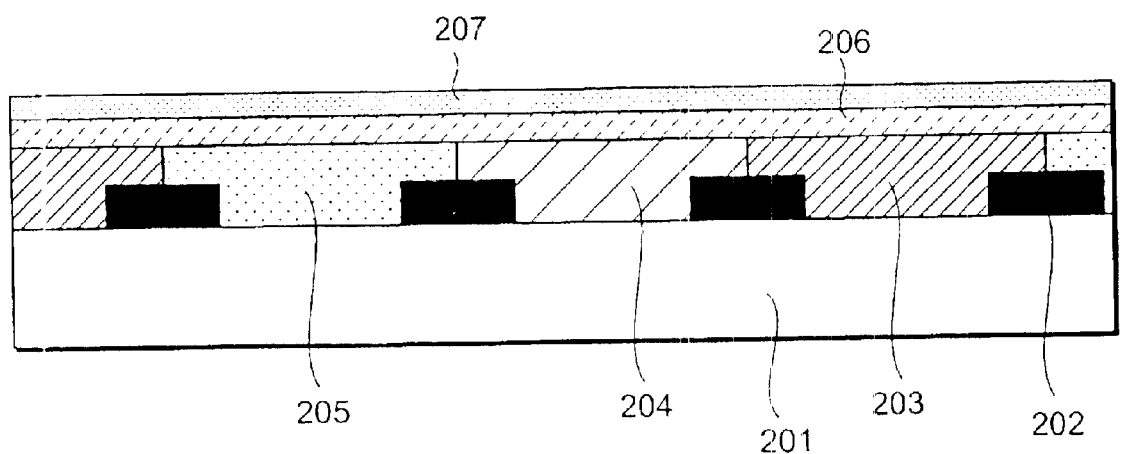
FIG. 2 is a cross section taken along a line I—I in FIG. 1.

Referring to FIG. 1 and FIG. 2, a color filter according to the present invention includes a transparent substrate 201, a light shielding layer 202 made of either metal or black resist formed on the transparent substrate 201, a color layer including a red colored resist 203, a green colored resist 204 and a blue colored resist 205, which are formed on the light shield layer 202, a transparent organic interlayer film 206 formed on the color layer and an opposing electrode 207 formed of a transparent electrically conductive material formed on the transparent organic interlayer film 206.

The transparent substrate 201 may be made of any transparent material provided that its physical properties and configuration are not changed in a heat processing in a fabrication method. Glass, quartz or plastics may be used the transparent substrate 201. When the transparent substrate is used for a flat display panel, glass is generally used.

The light shield layer 202 is provided in order to prevent colors of lights transmitted the filter from being mixed to thereby improve quality of the optical filter. Although, the light shield layer 202 is not always necessary, the light shield layer 202 may be formed by using photolithography and etching of a metal layer of such as chromium having light shielding characteristics or by coating the substrate with light sensitive black resist and exposing and developing with using a desired pattern.

A material of the resist, which is differently colored in forming the color layer, may be any, provided that its characteristics is changed when irradiated with UV light. A negative type light sensitive resist formed of light sensitive polyimide, PVA resin, light sensitive acrylic resin or light sensitive epoxy resin is usually used as the resist material. A coating method of the resist is also any and the coating is performed by, for example, a spin coat, a slit coat or a coating, etc.

In this embodiment, in order to prevent characteristics the color layer, that is, the colored resists from being changed or prevent the quality of the color layer from being degraded in the fabricating steps after the formation of the color layer, the color layer is coated the transparent organic interlayer film 206 having high anti-chemicals characteristics as an overcoat film. When a patterning of the overcoat film 206 is unnecessary, the overcoat film may be formed by coating a transparent organic resist and baking it normally. When the patterning of the overcoat is necessary, the overcoat film 206 is formed by exposing and developing the substrate coated with a light sensitive resist with using a desired pattern. In a case where the light sensitive resist used for the overcoat film is colored, the normal baking is performed after bleaching the light sensitive resist by exposing the developed light sensitive resist.

Figure 3:
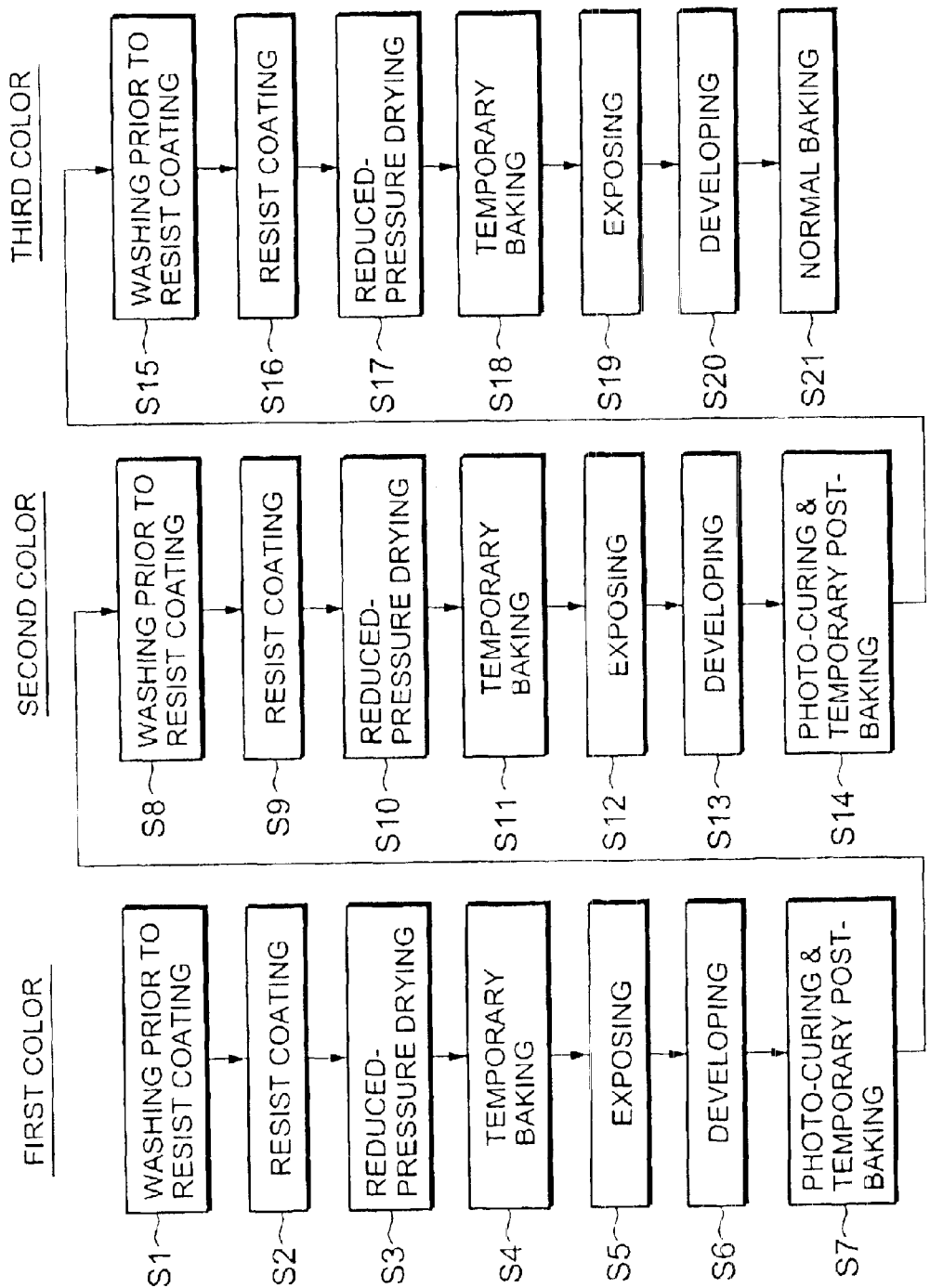
FIG. 3 is a flowchart showing a fabrication procedure of a color layer.

Now, the fabrication procedure for the color layer including the colored resists 203, 204 and 205 will be described with reference to the flowchart shown in FIG. 3.

After the washing step (step S1) of washing away extraneous substances adhered to the transparent substrate 202, the resist coating step (step S2) of coating the substrate with a light sensitive, first colored (red, for example) resist is performed. Then, the reduced-pressure drying step (step S3) of evaporating solvent contained in the red colored resist and the temporary baking step (step 4) are performed. Then, the exposing step (step S5) of exposing the substrate to print a pattern and the developing step (step S6) of developing the printed pattern are performed. Thereafter, the photo-curing step of hardening the printed pattern formed by light and heat to a hardness level in which the resist material is not solved in solvent used in a coating step to be performed later and the resist is not developed again in a second and subsequent developing steps and the temporary post-baking step are performed (step S7), resulting in a desired first colored resist pattern. The second colored (green color, for example) resist pattern is formed by repeating the above mentioned steps (step S8 to step S14). The third colored (blue color, for example) resist pattern is formed through the steps S15 to S20, which are the same as the steps (step S8 to step S13) for the second colored resist pattern. The normal baking step (S21) of completely hardening the resist patterns of all colors (red, green and blue) is performed.

The washing steps (steps S1, S8 and S15) for the red, green and blue color resists are preferably performed before the resist coating steps, respectively. The washing step may be performed by brushing, ultrasonic washing or chemical washing using isopropanol, etc. However, for a color layer pattern whose surface and interface on the substrate side are hardened by a photo-curing step for surface hardening and a thermal-curing step to be described later, it is preferable to wash it with pure water whose physical defect is small. The drying of the substrate after washed is performed at 120 to 180° C. for 2 to 5 minutes by using an infrared (IR) heater or a hotplate, etc.

The resist material used in the respective resist coating steps (steps S2, S9, S16) is a negative type light sensitive colored resist such as light sensitive polyimide, PVA resin, light sensitive acrylic resin and light sensitive epoxy resin, etc. A coating method of the resist is also any and the coating is performed by, for example, a spin coat, a slit coat or a coating, etc.

The reduced-pressure drying step (step S3, S10, S17) immediately after the resist coating step is to evaporate solvent contained in the resist and to make heat distribution uniform in the next temporary baking step and an aimed reduced-pressure and an aimed drying time are set according to an amount of resist material and a content of solvent thereof, etc.

The temporary baking step (step S4, S11, S18), is performed by a hotplate or an oven, etc., at 70~100° C. for about 2~4 minutes to evaporate a residual portion of the solvent in the resist after the reduced-pressure drying step.

The resist-coated substrate after the temporary baking step is exposed with a desired pattern in the exposing step (step S5, S12, S19). The exposing method may be any provided that the method denatures the light sensitivity of the resist. For example, this is performed by using a projection system using a mask or a laser drawing, etc. Light used in this exposing step may be any provided that it includes a wavelength to which the mask is sensitive. For example, ultraviolet ray, g, h or i ray of a mercury lamp, xenon lamp ray, excimer laser light, X ray, electron beam, ray, ion beam, etc., may be used.

After the exposing step, the development is performed in the developing step (step S6, S13, S20). The development is performed by a method suitable for constituents of the resist with using a developer, which is generally as an organic alkaline solution or an inorganic alkaline solution, etc.

In the present invention, the color layer is not completely hardened by the photo-curing and thermal hardening step for hardening only an upper surface of the color layer and an interface between a lower surface of the color layer and the substrate. Therefore, the position of the same step in the flowchart may be any. Alternatively, the hardening steps for the three colored resists may be performed simultaneously. The photo-curing portion of the photo-curing and temporary post-baking step (step S7, S14) performed by light irradiation of the present invention is to harden the upper surface of the color layer pattern in order to prevent succeeding color pigment and developer from soaking into the color layer. On the other hand, the temporary post-baking portion of the photo-curing and temporary post-baking step (step S7, S14) is to process the interface portion between the color layer pattern film obtained by the developing step and the underlying substrate such that a soaking of a succeeding color pigment and a succeeding developer into the color layer from the interface and a peeling-off of the color layer from the substrate is prevented.

Figure 4:
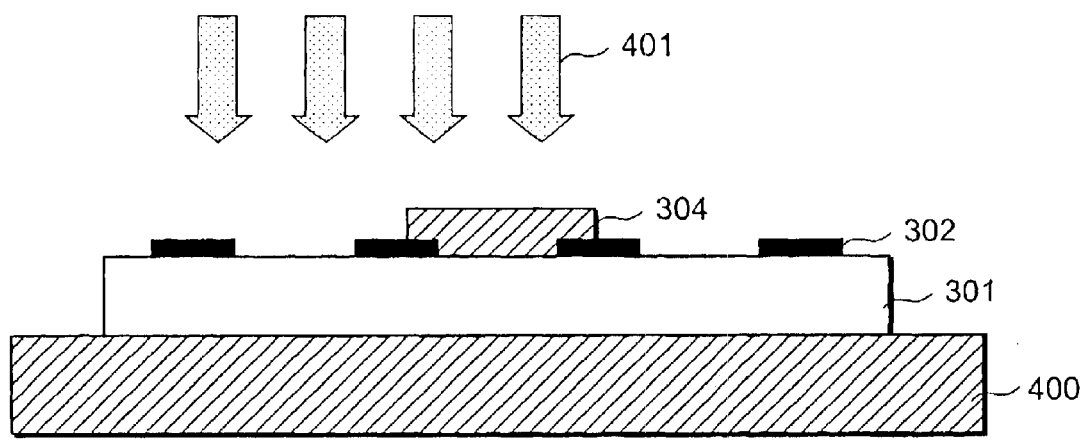
FIG. 4 shows a photo-curing step and a temporary post-baking step of the fabrication procedure shown in FIG. 3.

The photo-curing and temporary post-baking (thermosetting) step according to the present invention will be described in detail with reference to FIG. 4. In FIG. 4, a light shield film 302 is formed on a substrate 301 and a first color layer patterning film 304 is formed on the light shield film 302 through the developing step. In the photo-curing step (step S7, S14), a surface of the color layer patterning film 304 on the substrate 301 is irradiated with light 401 to harden a portion of the resist in the vicinity of the surface thereof irradiated with the light to a hardness level in which any abnormality does not occur in later steps. A light source to be used in the photo-curing step is similar to that used in the exposing step, provided that the light has a wavelength to which the resist is sensitive. Preferably, the light source used in the exposing step is also used in the photo-curing step in view of reduction of the fabrication cost. In this embodiment, the photo-curing step is performed by a simultaneous irradiation of normal pressure ultraviolet ray under a condition of about 1000 mj/cm$^2$. This condition is preferably 5~10 times the appropriate amount of exposure when the color layer pattern is exposed. In the above mentioned condition, the time required is only about one minute. By performing the photo-curing step, only the surface portion of the color layer pattern is hardened, so that it is possible to prevent the soaking of the developer, etc., from the surface portion in later steps. Compared with the conventional temporary baking step using an oven, the increasing time of temperature and the decreasing time of temperature become unnecessary, so that it becomes possible to effectively harden only the surface portion of the color layer within a short time.

Further, the temporary post-baking (simple thermosetting) step (step S7, S14) in the present invention is performed under the condition that the resist 304 formed on the substrate 301 is hardened to a hardness level in which the adhesiveness in the interface between the resist 304 and the substrate 301 is improved and the inconvenience such as soaking of developer into the interface in later steps does not occur. This heat-treatment is preferably performed by heating a rear surface of the substrate 301 with using a hotplate 400 shown in FIG. 4. The heating is performed under a condition of 120~150° C. for about 2~5 minutes. When the hotplate is used in lieu of an oven, it is possible to substantially reduce the increasing and decreasing times of temperature, compared with the case of the oven. Further, since the hotplate used in the drying step after the washing step of the substrate can be used as it is, it is possible to effectively use the merits of the hotplate, that is, compactness and low cost. Further, since the hotplate 400 is arranged below the rear or lower surface of the substrate 301 to heat the substrate as shown in FIG. 4, it is possible to easily harden the surface (interface) of the color layer 304 within a short time and to increase the adhesion force of the color layer to the substrate within the short time. Needless to say, the lower surface (interface) of the color layer 304 opposing to the light shielding film pattern 302 is also easily hardened within the short time.

The normal baking step (step S21) for simultaneously baking the colored resists normally after the last developed pattern among the plurality of the resist patterns is formed is executed at about 200~230° C. for about 1 hour by using a hotplate or an oven, etc. By this step, it is possible to prevent inconvenience of such as gas generation from a volatile material during a heat treatment in forming such as the transparent organic interlayer film 206 in the later step.

In the previously mentioned JPH11-337724A, after the exposing of the colored resist layer, the coated resist layer is hardened to a hardness level in which defect such as peeling-off of the resist layer does not occur in the developing step of the resist layers of other colors formed subsequently. In detail, the heat treatment is performed at 80~100° C. for 5~15 minutes (preferably, 90° C. for 10 minutes) by using a hotplate, an oven or infrared ray irradiation, etc. In this embodiment, however, the photo-curing step for hardening the upper surface of the color layer and the temporary post-baking step (light irradiation step and the simple thermal curing step) for hardening the lower surface (interface) of the color layer on the side of the substrate are used in the formation of the first and second colored resists. Therefore, the necessary and sufficient processing time to harden the surface becomes as short as about 20~40 minutes. Accordingly, it becomes possible to substantially reduce the overall fabrication time to thereby improve the producibility and reduce the stockpile in the step.

Incidentally, JPH8-194109A discloses a technique in which, instead of a heat-curing processing of the color pixel image obtained after the development, a photo-curing processing by means of an exposing device is used in at least one of the three steps except the last step among four steps for forming the black, red, green and blue color pixel images of the color filter fabrication method. In the disclosed technique, there is a description summarized as that, by employing anti-solvent photo-polymerizing constituents, the color pixel image, which is durable against a later coating of photo-polymerizing constituents, can be formed. That is, according to the disclosed technique, only the photo-curing by means of an exposing device is performed in the step corresponding to either the step S7 or the step S14 shown in FIG. 3. However, the prior art does neither disclose nor suggest the present invention in which not only the photo-curing but also the heat-curing for hardening only the surface of the color layer on the side of the substrate are used. Further, in the disclosed prior art, hardness of a portion of the color layer in the vicinity of the interface between the color layer and the substrate is insufficient and the improvement of the adhesion force obtainable by the present invention can not be expected though the effect of shortening of time is large compared with the case where the temporary post-bake step is employed. Further, since a special material is used for the color pixel image, the generality is low. Although the heat-curing processing after the developing processing is removed, very specific photo-polymerizing constituent is required. Therefore, realization of the disclosed technique is difficult by using commercially available resist material. Particularly, in order to obtain an intimate contact between the substrate and the color layer by light, the resist must be transmissive for the light. Since well known economical resist material can not be used, increase of fabrication cost is unavoidable. Particularly, for the black resist, light does not reach the interface between the substrate and the resist, it is difficult to obtain an intimate contact of the resist to the substrate.

In the present invention, however, it is possible to reduce the fabrication time and to restrict the increase of fabrication cost even when the conventional color resist is used. That is, in the present invention, in order to prevent the developer, etc., from soaking into the surface of the color layer and the interface between the color layer and the substrate in the next step, the hardening of the upper surface of the color layer is performed by using the light irradiation means and the lower surface thereof on the side of the interface is hardened by using the heat-curing means, so that the merit and demerit are compensated for, complementarily.

In this embodiment, it is possible, compared with the case where either one of the photo-curing and the heat-curing is performed, to improve the adhesiveness of the color layer (color resist pattern) to the transparent substrate 201 by using the photo-curing for hardening only the upper surface of the color layer and the heat-curing (temporary post-baking) for hardening only the lower surface of the color layer on the side of the substrate. Therefore, in forming another colored resist pattern, it is possible to not only prevent the developer used in the developing step from soaking into the surface of the colored resist pattern but also reliably prevent the developer from soaking into between the colored resist pattern and the transparent substrate 201. Since these effects can be achieved together with the shortening effect of the fabrication time, the utility of the present fabrication method is very high.

Now, a second embodiment of the present invention will be described with reference to FIG. 5.

In the first embodiment, the color filter layer is formed on the usual transparent substrate. However, the present invention can be applied to a formation of a color filter layer on a thin film transistor (TFT).

Figure 5:
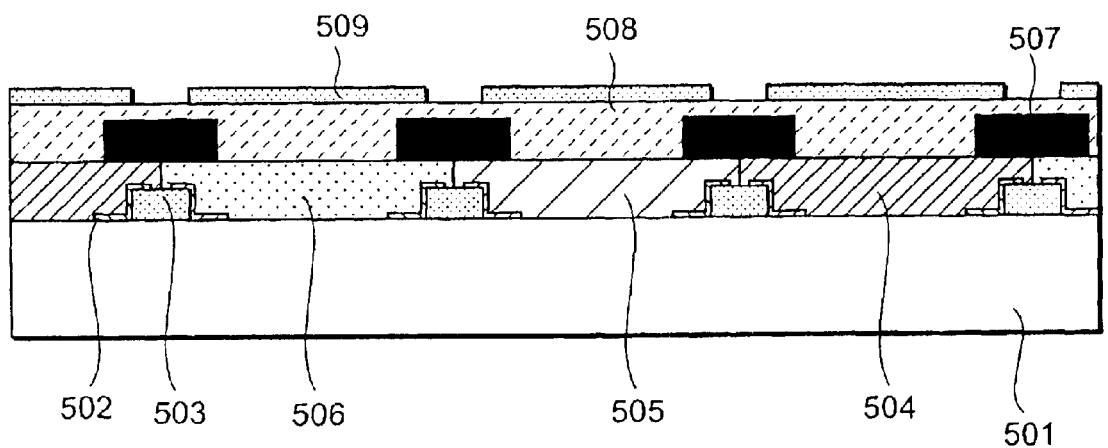
FIG. 5 is a plan view of a TFT array substrate having a color filter layer formed thereon.
Figure 6:
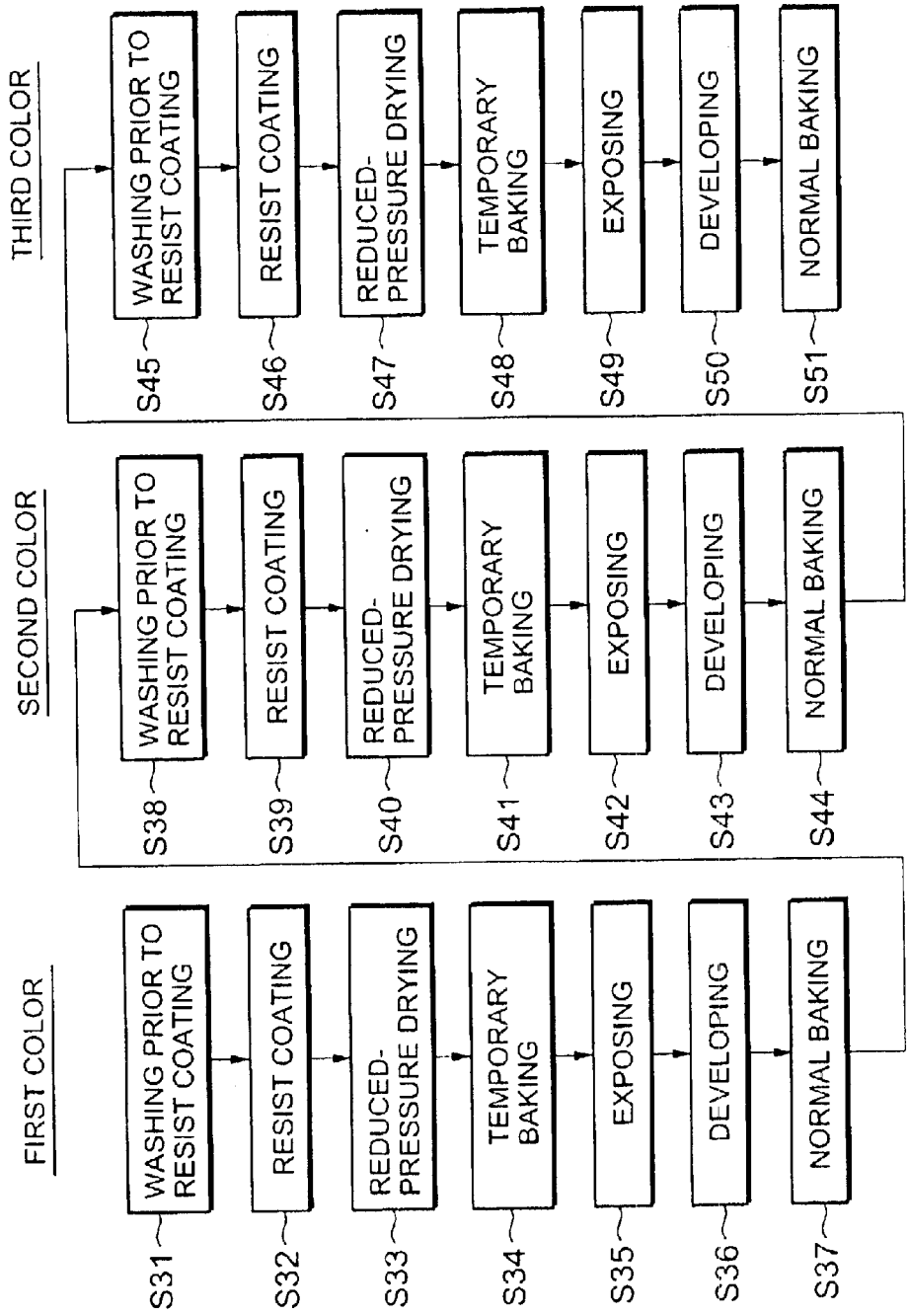
FIG. 6 is a flowchart showing a conventional fabrication procedure of a color filter layer.

In a TFT array substrate shown in FIG. 5, TFT's are formed by wiring portions 502 and amorphous silicon (a-Si) portions 503 formed on a transparent substrate 501. Metal film of such as chromium used as the wiring 502 is formed by sputtering, etc., and the a-Si portions 503 are formed by CVD, etc. On the TFT array substrate, a color layer composed of colored resists 504, 505 and 506 is formed along a fabrication procedure similar to that used in the first embodiment. A light shield layer 507 is formed of a metal or a black resist on the colored resists 504, 505 and 506 and, after a transparent organic interlayer film 508 is formed, pixel electrodes 509 of transparent conductive film are formed.

By forming the red colored resist 504, the green colored resist 505 and the blue colored resist 506 on the transparent substrate having the TFT's each including the wiring 502 and the a-Si portion 503 formed thereon, according to a procedure similar to that used in the first embodiment, it is possible to improve the adhesiveness of the color layer to the transparent substrate 501. Therefore, it is possible to prevent, in forming another colored resist pattern, the developer used in the developing step from soaking into between the colored resist pattern and the transparent substrate 501.

It should be noted that, although the preferred embodiments have been described, the present invention is not limited thereto and the preferred embodiments can be modified in various manners within the scope of the present invention. For example, when a light sensitive black resist is used as the light shield layer 202, it may be possible to harden only surface portions of the light shield layer 202, the first colored resist pattern and the second colored resist pattern by the photo-curing and the temporary post-baking and to completely harden them at the same time when the third colored resist pattern is formed, by the normal baking step. When a negative type resist similar to the color layers is used for the transparent organic interlayer film 206, it may be possible to harden only surface portions (including the interface to the substrate) of the first colored resist pattern, the second colored resist pattern and the third colored resist pattern by the photo-curing and the temporary post-baking and then to completely harden them at the same time when the transparent organic interlayer film 206 is formed, by the normal baking step. Further, it may be possible to harden only surface portions (including the interfaces to the substrate) of the light shield layer 202, the first colored resist pattern, the second colored resist pattern and the third colored resist pattern by the photo-curing and the temporary post-baking and then to completely harden them at the same time when the transparent organic interlayer film 206 is formed, by the normal baking step.

As described hereinbefore, in the steps for forming the color layers other than the last color layer forming step, only the surface portions (including the interface portions to the substrate) of the color layers other than the last color layer are hardened to a hardness level, in which there is no defect of the coated colored resist patterns in the resist coating step and the developing step, by the photo-curing step and the temporary post-baking step, instead of the normal baking. Therefore, the necessary and sufficient hardening processing can be completed within a time as short as about 20–40 minutes. Accordingly, it is possible to substantially reduce the fabrication time to thereby improve the producibility and reduce the stock in the respective steps. In addition, it is possible to improve the adhesiveness of the colored resist patterns to the substrate. Therefore, it is possible to prevent, in forming another colored resist pattern, the developer used in the developing step from soaking into between the colored resist pattern and the transparent substrate.

What is claimed is:

1. A color layer forming method for forming a color layer composed of a plurality of colored resists, comprising:
    a first step of forming a first colored resist pattern on a substrate by coating the substrate with a first colored resist, exposing the first colored resist to print the first colored resist pattern and developing the first colored resist;
    a second step of hardening only a surface portion of said first colored resist pattern by irradiating said surface portion with light;
    a third step of thermally curing a surface portion of said first colored resist pattern on the side of said substrate by heating said surface portion; and
    a baking step of baking the first colored resist pattern formed on said substrate in a last step, temperature in the baking step being higher than temperature used in the third step such that the whole portion of the first colored resist pattern having the hardened surface portions are simultaneously hardened,
    wherein said first step is performed for each of the plurality of colored resists and said second and third steps are performed for each colored resist except a last colored resist formed in said color layer.

2. A color layer forming method as claimed in claim 1, wherein the light used in the second step is a light from an exposing light source used in the first step and the third step is performed by using a local heat source arranged on a side of said substrate opposing to said colored resist pattern and heating said substrate.

3. A color layer forming method as claimed in claim 1, further comprising the step of repeating the first to third steps, wherein the resist pattern in the last step is colored by other color than that of the first colored resist.

4. A color layer forming method as claimed in claim 1, further comprising a step of repeating the first to third steps while changing color of the colored resist, wherein the resist pattern in the last step is an overcoat film.

5. A color layer forming method as claimed in claim 1, further comprising a step of repeating the first to third steps, wherein said first colored resist is black colored.

6. A color layer forming method as claimed in claim 1, wherein the first step performed for each of a plurality of colored resists comprises a resist coating step of coating a washed substrate with respective colored resists, a reduced-pressure drying and temporary baking step of evaporating solvent contained in the respective colored resists, an exposing step of exposing the substrate to print resist pattern and a developing step of developing the printed pattern, the second and third steps are a photo-curing step of hardening only a surface portion of the colored resist pattern by light and heat to a hardness level, in which there is no defect of the coated colored resist patterns in the resist coating step and a developing step to be performed later, and a temporary baking step for hardening a surface portion of the colored resist pattern on the side of the substrate, respectively.

7. A color layer forming method as claimed in claim 1, wherein a wiring and thin film transistors formed of amorphous silicon are preliminarily formed on the substrate.

8. A color layer forming method for forming a color layer including a plurality of colored resists on a substrate, comprising:

a first resist coating step of coating the substrate with a first colored resist;

a first evaporation step of evaporating solvent contained in the first colored resist after the first resist coating step;

a first exposing step of printing a pattern in the first colored resist after the first evaporation step;

a first developing step of forming a first colored resist pattern by developing the pattern printed in the first colored resist after the first exposing step;

a first photo-curing step of hardening an upper surface portion of the first colored resist pattern by light irradiation of said upper surface portion;

a first temporary baking step of hardening a rear surface of the first colored resist pattern by heat of a hotplate arranged below said rear surface;

a second resist coating step of coating the substrate having the first colored resist pattern with a second colored resist after the first photo-curing step and the first temporary baking step;

a second evaporation step of evaporating solvent contained in the second colored resist after the second resist coating step;

a second exposing step of printing a pattern in the second colored resist after the second evaporation step;

a second developing step of forming a second colored resist pattern by developing the pattern printed in the second colored resist after the second exposing step;

a second photo-curing step of hardening an upper surface portion of the second colored resist pattern by light irradiation of said surface portion thereof;

a second temporary baking step of hardening a rear surface of the second colored resist pattern by heat of a hotplate arranged below said rear surface of the second colored resist;

a third resist coating step of coating the substrate having the first colored resist pattern and the second colored resist pattern with a third colored resist after the second photo-curing step and the second temporary baking step;

a third evaporation step of evaporating solvent contained in the third colored resist after the third resist coating step;

a third exposing step of printing a pattern in the third colored resist after the third evaporation step;

a third developing step of forming a third colored resist pattern by developing the pattern printed in the third colored resist after the third exposing step; and a normal baking step of completely hardening the first colored resist pattern, the second colored resist pattern and the third colored resist pattern by simultaneously heating the first to third colored resist patterns at a temperature higher than temperatures in the first and second temporary baking steps.

9. A color filter forming method using the color layer forming method as claimed in claim 8, further comprising a step of forming a light shield layer of light sensitive black resist on said substrate, wherein all coated colored resist patterns including the light shield layer are simultaneously hardened in the normal baking step.

10. A color filter forming method using the color layer forming method as claimed in claim 8, further comprising a third photo-curing step of hardening an upper surface portion of the third colored resist pattern by light radiation of said surface portion of the third colored resist pattern before the normal baking step and a third temporary baking step of hardening a rear surface of the third colored resist pattern by heat of a hotplate arranged below said rear surface of the third colored resist pattern, the normal baking step being performed after an overcoat layer is formed on the first to third colored resist patterns after the third temporary baking step.

11. A color filter formed by the color layer forming method as claimed in claim 8.

* * * * *